(12) United States Patent
Takeuchi et al.

(10) Patent No.: US 11,463,045 B2
(45) Date of Patent: Oct. 4, 2022

(54) OSCILLATOR CIRCUIT AND RADIO RECEIVER

(71) Applicant: SONY SEMICONDUCTOR SOLUTIONS CORPORATION, Kanagawa (JP)

(72) Inventors: Hidenori Takeuchi, Kanagawa (JP); Naoya Arisaka, Kanagawa (JP); Hitoshi Tomiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/275,593

(22) PCT Filed: Aug. 20, 2019

(86) PCT No.: PCT/JP2019/032388
§ 371 (c)(1),
(2) Date: Mar. 11, 2021

(87) PCT Pub. No.: WO2020/066365
PCT Pub. Date: Apr. 2, 2020

(65) Prior Publication Data
US 2021/0328549 A1    Oct. 21, 2021

(30) Foreign Application Priority Data

Sep. 25, 2018    (JP) .............................. JP2018-178376

(51) Int. Cl.
*H03B 5/04*    (2006.01)
*H03B 5/12*    (2006.01)
*H04H 40/18*    (2008.01)
*H04B 1/16*    (2006.01)

(52) U.S. Cl.
CPC ................. *H03B 5/04* (2013.01); *H03B 5/12* (2013.01); *H03B 5/1215* (2013.01);
(Continued)

(58) Field of Classification Search
CPC .......... H03B 5/04; H03B 5/12; H03B 5/1228; H03B 5/1243; H03B 5/1265; H03B 5/1215; H04H 40/18; H04B 1/1638
(Continued)

(56) References Cited

U.S. PATENT DOCUMENTS 6,909,336 B1 *  6/2005  Rajagopalan ........... H03L 7/099
                                              331/109
8,816,790 B2 *  8/2014  Sinoussi .................. H03B 1/04
                                              331/116 R
(Continued)

FOREIGN PATENT DOCUMENTS

CN           1645739 A       7/2005
CN         102017417 A       4/2011
(Continued)

OTHER PUBLICATIONS

International Search Report and Written Opinion of PCT Application No. PCT/JP2019/032388, dated Aug. 8, 2019, 10 pages of ISRWO.

*Primary Examiner* — Arnold M Kinkead
(74) *Attorney, Agent, or Firm* — Chip Law Group

(57) ABSTRACT

Provided is an oscillator circuit including an LC oscillator circuit, an amplitude detection circuit, and a bias generation circuit, in which the LC oscillator circuit includes an inductor and at least one variable capacitance element, the amplitude detection circuit detects an oscillation amplitude of the LC oscillator circuit and converts the oscillation amplitude into a DC voltage, and the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude.

11 Claims, 8 Drawing Sheets

(52) U.S. Cl.
CPC ......... *H03B 5/1228* (2013.01); *H03B 5/1243* (2013.01); *H03B 5/1265* (2013.01); *H04H 40/18* (2013.01); *H04B 1/1638* (2013.01)

(58) Field of Classification Search
USPC .......................................... 331/167, 117 FE
See application file for complete search history.

(56) References Cited

U.S. PATENT DOCUMENTS

| | | | |
|---|---|---|---|
| 10,892,710 B2 * | 1/2021 | Chen | .................... H03B 5/1228 |
| 2005/0156681 A1 | 7/2005 | Takinami et al. | |
| 2005/0231297 A1 | 10/2005 | Aparin et al. | |
| 2009/0261917 A1 | 10/2009 | Taghivand et al. | |
| 2016/0118991 A1 | 4/2016 | Huang | |
| 2016/0254811 A1 | 9/2016 | Otsuka et al. | |
| 2016/0254816 A1 | 9/2016 | Kobayashi | |

FOREIGN PATENT DOCUMENTS

| | | | | |
|---|---|---|---|---|
| EP | 3576300 A1 * | 12/2019 | ........... | H03B 5/1212 |
| JP | 2004-312080 A | 11/2004 | | |
| JP | 2005-236959 A | 9/2005 | | |
| JP | 2006-339727 A | 12/2006 | | |
| JP | 2011-10343 A | 1/2011 | | |
| JP | 2011-518535 A | 6/2011 | | |
| JP | 2011-239285 A | 11/2011 | | |
| JP | 2015-527848 A | 9/2015 | | |
| JP | 2016-96533 A | 5/2016 | | |
| JP | 2016-163061 A | 9/2016 | | |
| TW | 200703933 A | 1/2007 | | |

* cited by examiner

OSCILLATOR CIRCUIT AND RADIO RECEIVER

CROSS REFERENCE TO RELATED APPLICATIONS

This application is a U.S. National Phase of International Patent Application No. PCT/JP2019/032388 filed on Aug. 20, 2019, which claims priority benefit of Japanese Patent Application No. JP 2018-178376 filed in the Japan Patent Office on Sep. 25, 2018. Each of the above-referenced applications is hereby incorporated herein by reference in its entirety.

TECHNICAL FIELD

The present technology relates to an oscillator circuit and a radio receiver, and more particularly to a technology for improving the operability of an analog tuning radio.

BACKGROUND ART

In a case of listening to a radio broadcast by use of a radio receiver, a frequency of a broadcasting station may be adjusted manually.

In this case, even if the frequency of the broadcasting station is manually adjusted, the radio broadcast may not be listened to due to a change in the temperature of the radio receiver. For example, in a case of receiving the radio broadcast for a long time, the reception sensitivity may deteriorate or the radio broadcast may not be listened to properly in the middle of the radio broadcast even though the radio broadcast can be received at first.

Here, in order to prevent the frequency from fluctuating due to a temperature characteristic of an oscillator circuit of the radio receiver, a technology for reducing a temperature fluctuation of the oscillator circuit has been studied (see, for example, Patent Document 1 and Patent Document 2).

CITATION LIST

Patent Document

Patent Document 1: Japanese Patent Application Laid-Open No. 2004-312080
Patent Document 2: Japanese Patent Application Laid-Open No. 2015-527848

SUMMARY OF THE INVENTION

Problems to be Solved by the Invention

Incidentally, in a manual analog tuning radio that uses a free-run oscillator circuit without using a phase locked loop (PLL), a local oscillation frequency fluctuates due to the temperature fluctuation. In this case, the reception performance deteriorates, and it may be necessary to tune the radio again.

The present technology has been made in view of such a situation, and a main purpose thereof is to provide an oscillator circuit and a radio receiver capable of reducing a frequency fluctuation of an oscillation frequency to a small extent.

Solutions to Problems

As a result of diligent research to solve the above-described object, the present inventor has succeeded in reducing the frequency fluctuation of the oscillation frequency to a small extent, and has completed the present technology.

That is, in the present technology, first, there is provided an oscillator circuit including
an LC oscillator circuit,
an amplitude detection circuit, and
a bias generation circuit, in which
the LC oscillator circuit includes an inductor and at least one variable capacitance element,
the amplitude detection circuit detects an oscillation amplitude of the LC oscillator circuit and converts the oscillation amplitude into a DC voltage, and
the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude.

In the oscillator circuit according to the present technology, the LC oscillator circuit may include a capacitor bank and a temperature compensation varicap,
the capacitor bank may include a MOS switch, and
the temperature compensation varicap may prevent a capacitance value of the capacitor bank from fluctuating due to a temperature fluctuation of the MOS switch. In this case, temperature dependence of the temperature compensation varicap may be different from temperature dependence of the capacitor bank.

Furthermore, the temperature compensation varicap may include a MOS varicap and,
a bias voltage may be applied to the MOS varicap to prevent the capacitance value of the capacitor bank from fluctuating.

In this case, the bias voltage may be generated by a bias circuit including a resistor and a diode.

In the oscillator circuit according to the present technology, the bias signal may be a voltage.

In the oscillator circuit according to the present technology, a cross couple of n-type MOS transistors may further be included,
sources of the cross couple of the n-type MOS transistors may be commonly connected, and a constant current source may be connected between a point where the common connection is made and a ground. In this case, each of drains of the cross couple of the n-type MOS transistors may be connected to the inductor and the variable capacitance element, and
a current value of the constant current source may be controlled to control the oscillation amplitude.

In the oscillator circuit according to the present technology, a cross couple of n-type MOS transistors may further be included,
sources of the cross couple of the n-type MOS transistors may be commonly connected, and a resistor may be connected between a point where the common connection is made and a ground. In this case, a capacitance element may be connected between the sources of the cross couple of the n-type MOS transistors.

Furthermore, in the present technology, there may be provided a radio receiver equipped with an oscillator circuit including
an LC oscillator circuit,
an amplitude detection circuit, and
a bias generation circuit, in which
the LC oscillator circuit includes an inductor and at least one variable capacitance element, the amplitude detection circuit detects an oscillation amplitude of the LC oscillator circuit and converts the oscillation amplitude into a DC voltage, and the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude.

According to the present technology, it is possible to provide an oscillator circuit and a radio receiver capable of reducing the frequency fluctuation of the oscillation frequency to a small extent, so that the operability of an analog tuning radio receiver can be improved. Note that the effect of the present technology is not necessarily limited to the above effect, and may be any effect described in the present technology.

MODE FOR CARRYING OUT THE INVENTION

Hereinafter, suitable modes for carrying out the present technology will be described with reference to the drawings. Note that embodiments described below are examples of typical embodiments of the present technology, and the scope of the present technology should not be narrowly construed by these embodiments.

Note that the description will be made in the following order.

1. Outline of Present Technology
2. First Embodiment (Example of Oscillator Circuit)
3. Second Embodiment (Example of Temperature Compensation Varicap)
4. Third Embodiment (Example of Current Control)
5. Fourth Embodiment (Example 1 of Voltage Control)
6. Fifth Embodiment (Example 2 of Voltage Control)
7. Sixth Embodiment (Radio Receiver)

1. Outline of Present Technology

First, the outline of the present technology will be described. The present technology relates to a configuration of a local oscillator circuit used in a radio receiver. According to the present technology, it is possible to reduce an amplitude fluctuation of an LC oscillator circuit due to a temperature change, so that a manually tuned frequency can be maintained. In addition, since adding a temperature compensation varicap makes it possible to reduce a change in a variable capacitor due to the temperature change, it is possible to reduce a fluctuation in an oscillation frequency and improve the operability of an analog tuning radio.

Figure 11:
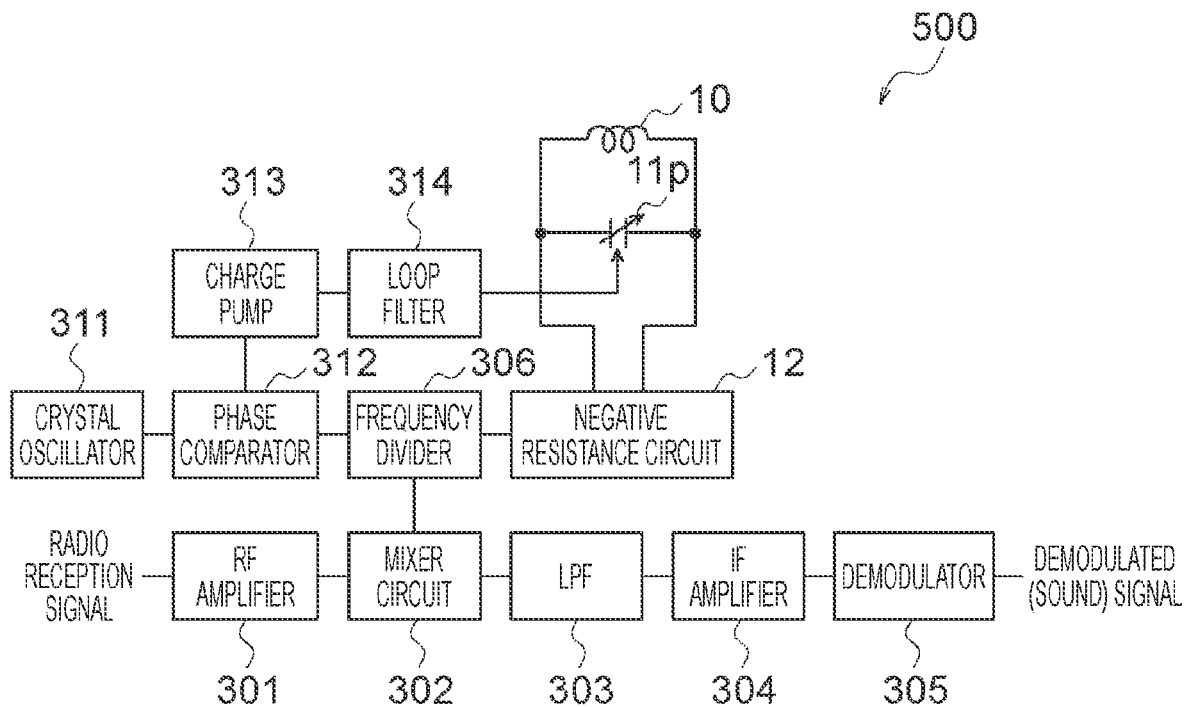
FIG. 11 is a block diagram of a preexisting radio receiver (Part 1).

First, a preexisting radio receiver will be described. FIG. 11 illustrates a block diagram of the preexisting radio receiver. FIG. 11 is the block diagram of the preexisting radio receiver.

As illustrated in FIG. 11, a radio receiver 500 includes an RF amplifier 301, a mixer circuit 302, an LPF 303, an IF amplifier 304, a demodulator 305, a frequency divider 306, a crystal oscillator 311, a phase comparator 312, a charge pump 313, a loop filter 314, an inductor (coil) 10, a variable capacitor (variable condenser) 11$p$, and a negative resistance circuit 12.

First, the radio receiver 500 amplifies an AM-modulated or FM-modulated high-frequency radio signal with the RF amplifier 301. The radio receiver 500 then converts the amplified high-frequency radio signal into a low-frequency intermediate frequency in the mixer circuit 302. The intermediate frequency obtained by the conversion is amplified by the IF amplifier 304 after a high frequency component is cut off via the LPF 303. The amplified intermediate frequency is then demodulated (detected) by the demodulator 305 and output as sound.

Here, the frequency conversion into the intermediate frequency is performed by a local oscillation signal having a frequency difference from an input frequency to the intermediate frequency being multiplied by an input signal in the mixer circuit 302. In this case, for the local oscillation signal, an oscillator circuit capable of converting the frequency over a wide band is required in order to cover the entire radio signal band.

To generate the local oscillation signal, the negative resistance circuit 12 and an LC oscillator circuit that oscillates at a frequency of $1/(2\pi\sqrt{LC})$, where an inductance value (inductor 10) is L and a capacitance value (variable capacitor 11$p$) is C, are used. The LC oscillator circuit changes the frequency by using a variable capacitor as a capacitor, and covers the frequency band of the radio.

Here, in order to match an oscillation frequency with a reception frequency and the intermediate frequency, an LC oscillator circuit is widely used in which a voltage-controlled oscillator circuit is configured by use of a variable capacitor whose capacitance value changes according to an input voltage, as a capacitor of the LC oscillator circuit, and a phase locked loop (PLL) synthesizer is used that can obtain a local oscillation signal with the accuracy of a reference frequency generated by a crystal oscillator or the like.

In a case of using the PLL, in addition to the voltage-controlled oscillator circuit that changes the frequency according to the input voltage, it is necessary to use the crystal oscillator 311, the frequency divider 306, the phase comparator 312, the charge pump 313, the loop filter 314, and the like for generating a reference frequency signal. Furthermore, since a control microcomputer, a liquid crystal display unit, and the like are required, the power consumption is large and the costs are high although the frequency accuracy is good.

Figure 12:
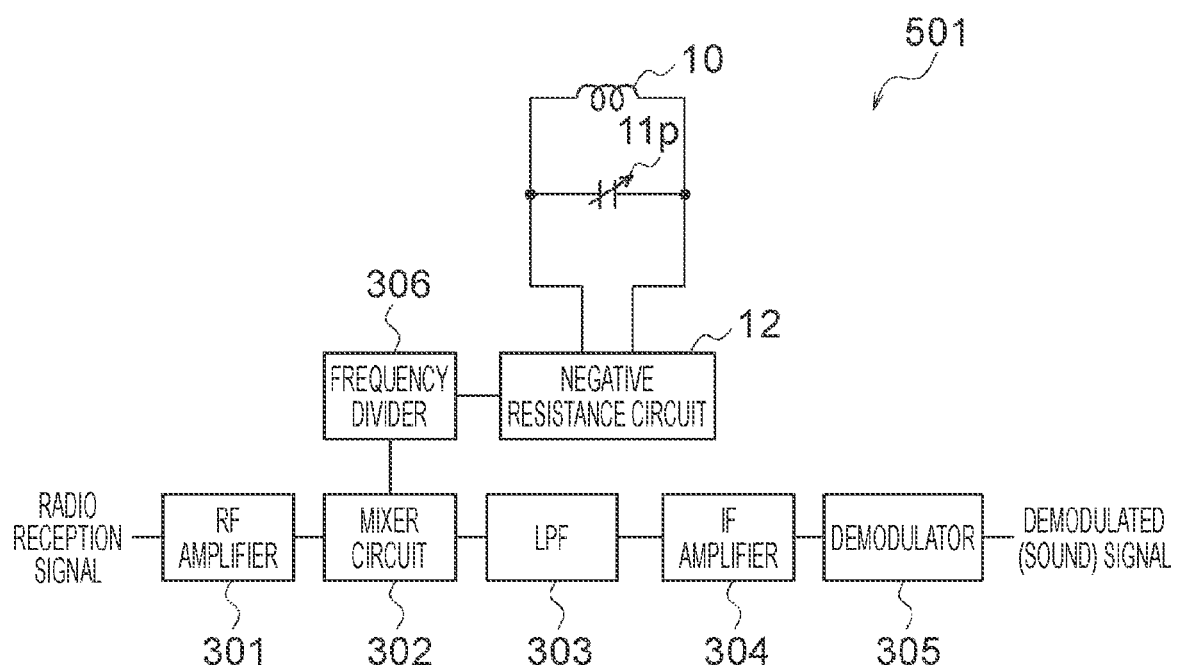
FIG. 12 is a block diagram of the preexisting radio receiver (Part 2).

For this reason, for a low power consumption radio receiver that is inexpensive and requires long-term operation with a dry battery or the like, as illustrated in FIG. 12, a radio receiver 501 is still widely used in which a variable capacitor (hereinafter referred to as a variable capacitor) 11p whose capacitance value changes mechanically is used as a capacitor of an LC oscillator circuit without using a PLL, to obtain a local oscillation signal by a user manually changing the capacitance value.

However, in recent years, costs of the variable capacitors have been increasing due to a decrease in production of the variable capacitors, and thus, in order to reduce costs of the low power consumption radio receivers, it is necessary to incorporate a function of the variable capacitor into an IC.

Here, in order to incorporate the function of the variable capacitor into the IC, there is a method of obtaining a required local oscillation signal, in which A/D conversion is performed on an input DC voltage from the outside, the capacitance value of the LC oscillator circuit is controlled with high resolution, and a frequency divider is combined.

In this case, the local oscillation signal is obtained by a free-run oscillator circuit, and if there is a frequency fluctuation due to a temperature fluctuation, the local oscillation signal fluctuates due to the temperature fluctuation after tuning, and the reception performance deteriorates or the reception itself is impossible. Therefore, in a case where the reception performance deteriorates or the radio cannot be received, it is necessary to manually adjust a frequency fluctuated due to the temperature fluctuation, separately. In this case, it is troublesome to manually adjust the frequency again, and thus it is necessary to reduce the temperature fluctuation of the oscillation frequency.

Here, as an example of reducing a temperature characteristic of the oscillation frequency, for example, Japanese Patent Application Laid-Open No. 2004-312080 discloses that, regarding the "oscillator circuit", a back gate voltage of an n-type MOS transistor of a ring oscillator is given a temperature characteristic, so that the temperature fluctuation of the oscillation frequency is reduced. However, this is a form that cannot be used in the LC oscillator circuit.

Furthermore, in Japanese Patent Application Laid-Open No. 2015-527848, "temperature-stable LC oscillator and oscillation method in temperature null phase" is disclosed, and the temperature fluctuation is reduced by use of a phase correction circuit for the LC oscillator, but it is difficult to apply this technology to a wideband oscillator for a radio.

Therefore, in the present technology, a reference voltage required for bias generation is given temperature dependence (temperature characteristic), so that an oscillation amplitude is controlled by the temperature, and thus an oscillation frequency fluctuation due to the temperature fluctuation is reduced. As a result, the fluctuation in the oscillation frequency due to the temperature can be reduced to a small extent.

2. First Embodiment (Example of Oscillator Circuit)

An oscillator circuit of a first embodiment according to the present technology includes an LC oscillator circuit, an amplitude detection circuit, and a bias generation circuit, the LC oscillator circuit includes an inductor and at least one variable capacitance element, the amplitude detection circuit detects an oscillation amplitude of the LC oscillator circuit and converts the oscillation amplitude into a DC voltage, and the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude.

According to the oscillator circuit of the first embodiment according to the present technology, the fluctuation in the oscillation amplitude can be reduced, and thus a temperature fluctuation of an oscillation frequency can be reduced, so that it is possible to continuously listen to a broadcasting station received by an analog tuning radio.

Figure 1:
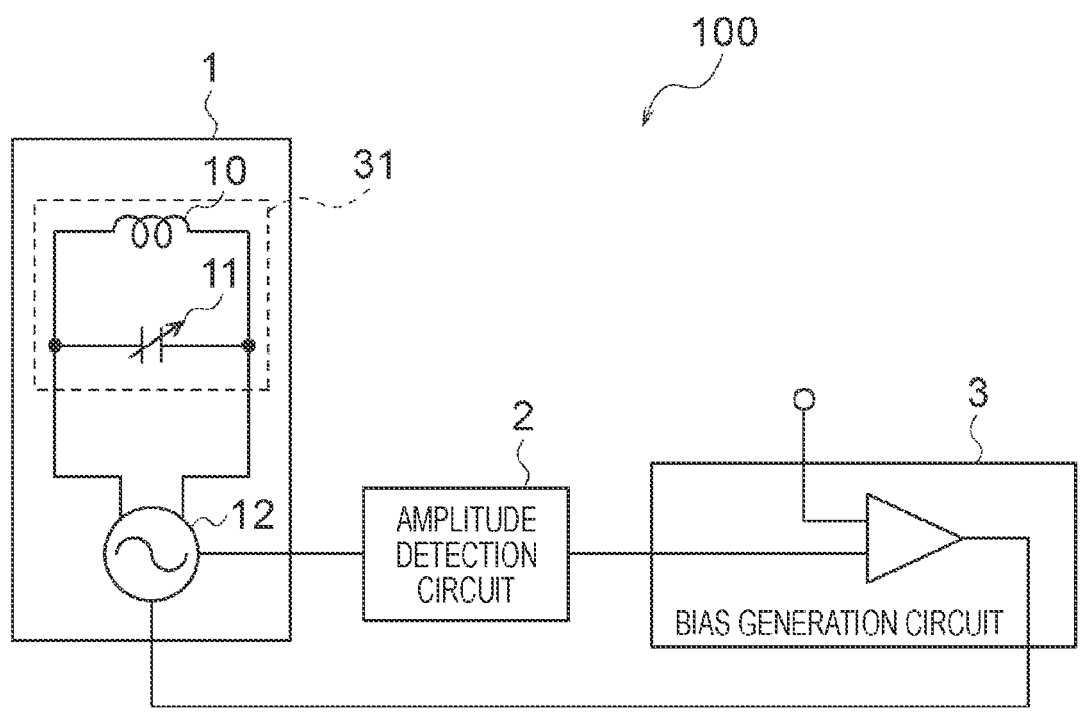
FIG. 1 is a block diagram illustrating an oscillator circuit that is an example of an oscillator circuit of a first embodiment according to the present technology.

FIG. 1 illustrates an oscillator circuit 100, which is an example of an oscillator circuit of the first embodiment according to the present technology. FIG. 1 is a block diagram illustrating a configuration example of the oscillator circuit 100 to which the present technology is applied. Note that, unless otherwise specified, "upper" means an upper direction in FIG. 1, and "lower" means a lower direction in FIG. 1. Furthermore, components common to the radio receivers illustrated in FIGS. 11 and 12 are designated by the same reference signs, and the description thereof will be omitted as appropriate.

The oscillator circuit 100 illustrated in FIG. 1 includes an LC oscillator circuit 1, an amplitude detection circuit 2, and a bias generation circuit 3.

The LC oscillator circuit 1 includes a resonance circuit 31 and a negative resistance circuit 12. The resonance circuit 31 includes an inductor 10 and at least one variable capacitance element 11. The resonance circuit 31 is connected to the negative resistance circuit 12 and oscillates at a resonance frequency of the resonance circuit 31 to generate a differential signal S1 and a differential signal S2.

Figure 2:
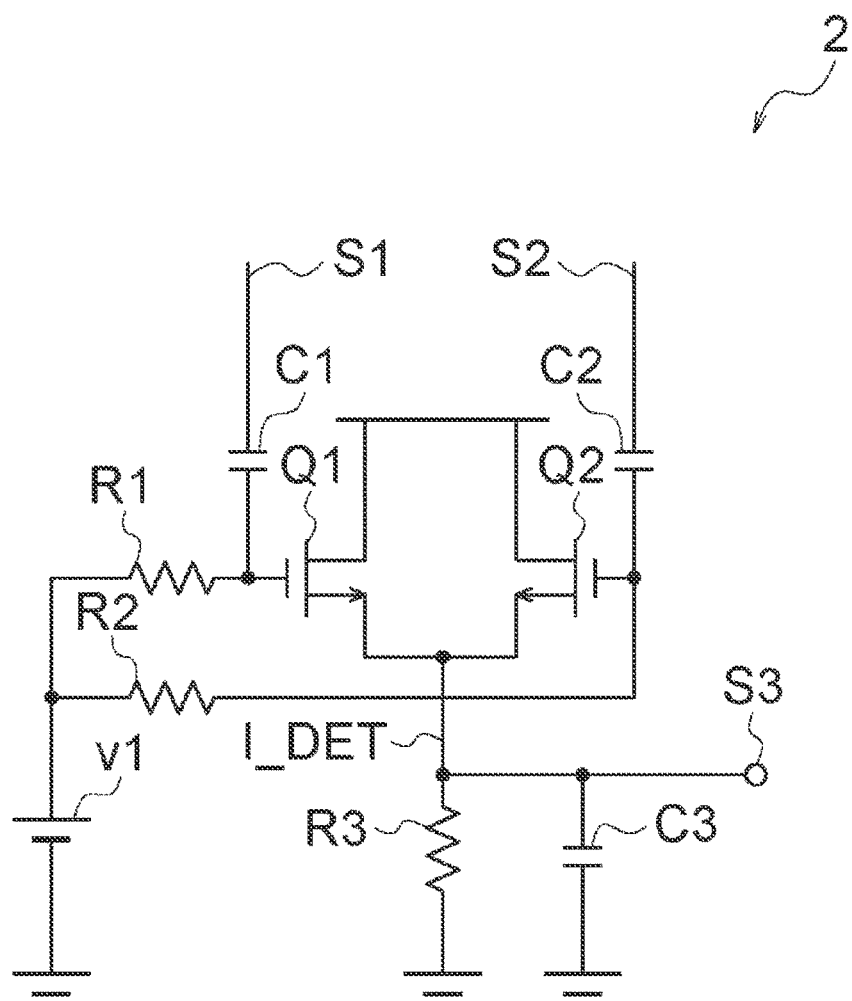
FIG. 2 is a block diagram illustrating an amplitude detection circuit of the oscillator circuit of the first embodiment according to the present technology.

FIG. 2 illustrates the amplitude detection circuit 2 of the oscillator circuit 100 of the first embodiment according to the present technology. FIG. 2 is a block diagram of the amplitude detection circuit 2 of the oscillator circuit 100 of the first embodiment according to the present technology.

The amplitude detection circuit 2 converts an input amplitude (an input oscillation amplitude of the LC oscillator circuit 1) into a DC voltage.

Specifically, as illustrated in FIG. 2, the differential signal S1, which is an oscillation signal output from the LC oscillator circuit 1, is supplied to a gate of an n-type MOS transistor Q1 via a capacitor C1. Furthermore, the differential signal S2, which is an oscillation signal output from the LC oscillator circuit 1, is supplied to a gate of an n-type MOS transistor Q2 via a capacitor C2. Furthermore, the gates of the n-type MOS transistor Q1 and the n-type MOS transistor Q2 are connected to a DC power supply V1 via a resistor R1 and a resistor R2, respectively.

Drains of the n-type MOS transistor Q1 and the n-type MOS transistor Q2 are each connected to a power supply voltage. Furthermore, sources of the n-type MOS transistor Q1 and the n-type MOS transistor Q2 are commonly connected to output an amplitude detection signal S3 and are connected to a resistor R3 and a capacitor C3. Note that the other end not connected to the resistor R3 and the other end not connected to the capacitor C3 are each grounded.

As a result, a current I_DET is output according to an amplitude of a higher differential input of the oscillation signal (differential signal) S1 supplied to the gate of the n-type MOS transistor Q1 and the oscillation signal (differential signal) S2 supplied to the gate of the n-type MOS transistor Q2. The current I_DET is full-wave rectified by the resistor R3 and the capacitor C3, converted into a DC voltage, and output as the amplitude detection signal S3. In this case, the larger the input amplitude, the higher the DC voltage.

With such a circuit configuration, the amplitude detection circuit 2 can detect the oscillation amplitude of the LC oscillator circuit 1 and convert the oscillation amplitude into the DC voltage. Note that the configuration of the amplitude detection circuit 2 is not limited to this.

Figure 3:
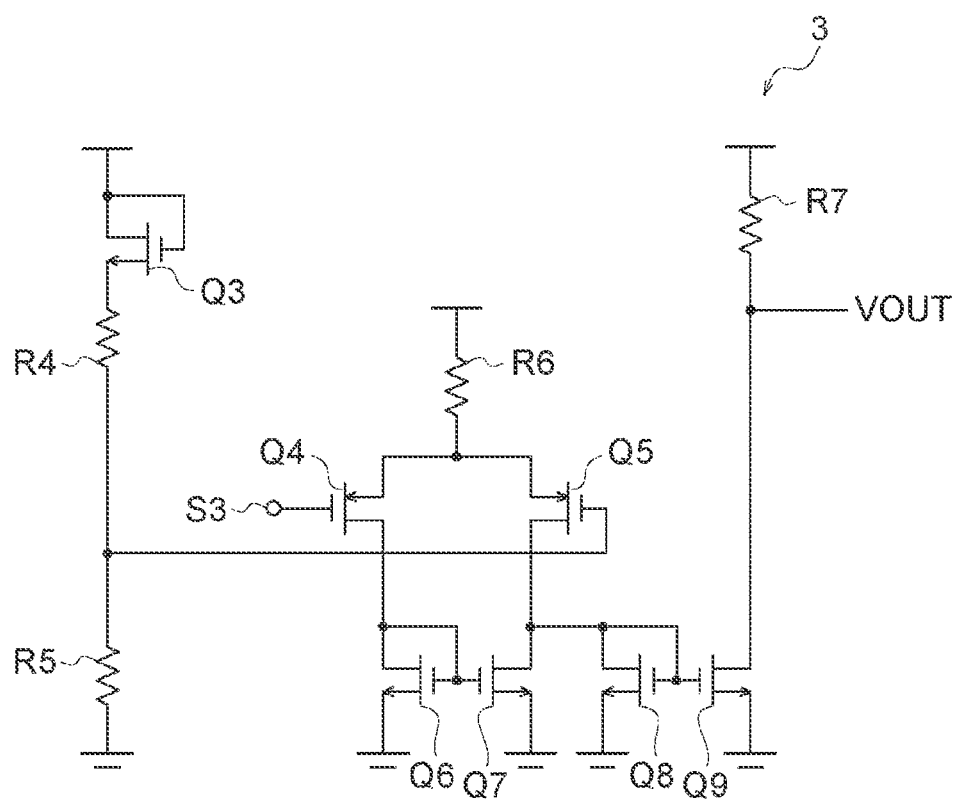
FIG. 3 is a block diagram illustrating a bias generation circuit of the oscillator circuit of the first embodiment according to the present technology.

FIG. 3 illustrates the bias generation circuit 3 of the oscillator circuit 100 of the first embodiment according to the present technology. FIG. 3 is a block diagram of the bias generation circuit 3 of the oscillator circuit 100 of the first embodiment according to the present technology.

The bias generation circuit 3 generates a bias signal on the basis of the amplitude detection signal S3 from the amplitude detection circuit 2 and applies the bias signal to the negative resistance circuit 12.

As illustrated in FIG. 3, an n-type MOS transistor Q3 is a transistor in which a gate and a drain are connected and temperature dependence is given to a voltage between the gate and a source. The source of the n-type MOS transistor Q3 is connected to a resistor R4. The resistor R4 and a resistor R5 divide a gate voltage of a p-type MOS transistor Q5. The amplitude detection signal S3 as the DC voltage converted by the amplitude detection circuit 2 is input to a gate of a p-type MOS transistor Q4.

A source of the p-type MOS transistor Q4 and a source of the p-type MOS transistor Q5 are commonly connected and connected to a power supply voltage via a resistor R6. A drain of the p-type MOS transistor Q4 is connected to a drain of an n-type MOS transistor Q6. The drain and a gate of the n-type MOS transistor Q6 are connected, and the n-type MOS transistor Q6 and an n-type MOS transistor Q7 form a current mirror. Sources of the n-type MOS transistor Q6 and the n-type MOS transistor Q7 are each grounded.

Furthermore, a drain of the p-type MOS transistor Q5 is connected to a drain of the n-type MOS transistor Q7, and is also connected to a drain and a gate of an n-type MOS transistor Q8. The n-type MOS transistor Q8 and an n-type MOS transistor Q9 form a current mirror, and a drain of the n-type MOS transistor Q9 is connected to a power supply voltage via a resistor R7. Furthermore, a node between the drain of the n-type MOS transistor Q9 and the resistor R7 has a bias voltage VOUT.

As a result, for example, in a case where a reference voltage (a voltage for generating the bias signal, for example, the gate voltage of the p-type MOS transistor Q5. The same applies hereinafter) and a voltage of the input amplitude detection signal S3 are the same value, the same current value flows through the p-type MOS transistor Q4 and the p-type MOS transistor Q5, and thus, currents in the current mirror of the n-type MOS transistor Q6 and the n-type MOS transistor Q7 are also stable at the same value. Furthermore, a drain voltage of the n-type MOS transistor Q7 is applied to the gate of the n-type MOS transistor Q8, and the bias voltage VOUT is determined by a voltage drop of the resistor R7 by the current mirror of the n-type MOS transistor Q8 and the n-type MOS transistor Q9.

Here, due to the temperature dependence of the n-type MOS transistor Q3, when the temperature of the bias generation circuit 3 rises, the reference voltage also rises. For example, in a case where the voltage of the input amplitude detection signal S3 is higher than the reference voltage, a large amount of current flows on a side of the p-type MOS transistor Q5, and the currents in the current mirror of the n-type MOS transistor Q6 and the n-type MOS transistor Q7 decrease. Then, a large amount of current flows through the n-type MOS transistor Q8, a current of the n-type MOS transistor Q9 also increases, and the bias voltage VOUT is lowered. As described above, when the amplitude increases, such a state occurs, and the bias voltage VOUT is lowered to lower the oscillation amplitude.

On the other hand, for example, in a case where the voltage of the input amplitude detection signal S3 is lower than a voltage of the reference voltage, a large amount of current flows on a side of the p-type MOS transistor Q4, and the currents in the current mirror of the n-type MOS transistor Q6 and the n-type MOS transistor Q7 increase. Then, the gate voltage of the n-type MOS transistor Q8 is lowered, the current of the n-type MOS transistor Q9 also decreases, and the bias voltage rises. As described above, when the amplitude is lowered, such a state occurs, and the bias voltage is raised to raise the oscillation amplitude.

With such a circuit configuration, the bias generation circuit 3 compares the DC voltage with the voltage (reference voltage) for generating the bias signal, the voltage changing on the basis of the temperature fluctuation of the bias generation circuit 3, to calculate the difference between the DC voltage and a voltage after the change. Furthermore, the bias generation circuit 3 generates, on the basis of the difference, the bias signal that reduces the fluctuation in the oscillation amplitude, to control the oscillation amplitude. In this case, the bias signal is a voltage, and a bias voltage can be configured. Note that the configuration of the bias generation circuit 3 is not limited to this.

As described above, the oscillator circuit 100 of the first embodiment according to the present technology can reduce the fluctuation in the oscillation amplitude due to the temperature fluctuation, so that the fluctuation in the oscillation frequency due to the temperature can be reduced to a small extent.

3. Second Embodiment (Example of Temperature Compensation Varicap)

Next, an oscillator circuit of a second embodiment according to the present technology is, in the first embodiment, an oscillator circuit in which the LC oscillator circuit includes a capacitor bank and a temperature compensation varicap, the capacitor bank includes a MOS switch, and the temperature compensation varicap prevents a capacitance value of the capacitor bank from fluctuating due to a temperature fluctuation of the MOS switch.

According to the oscillator circuit of the second embodiment according to the present technology, the temperature compensation varicap can prevent the capacitance value of the capacitor bank from fluctuating due to the temperature fluctuation of the MOS switch, and thus a fluctuation in an oscillation frequency can be reduced with high accuracy, and a good reception state can always be maintained even if a free-run oscillator is used.

Figure 4:
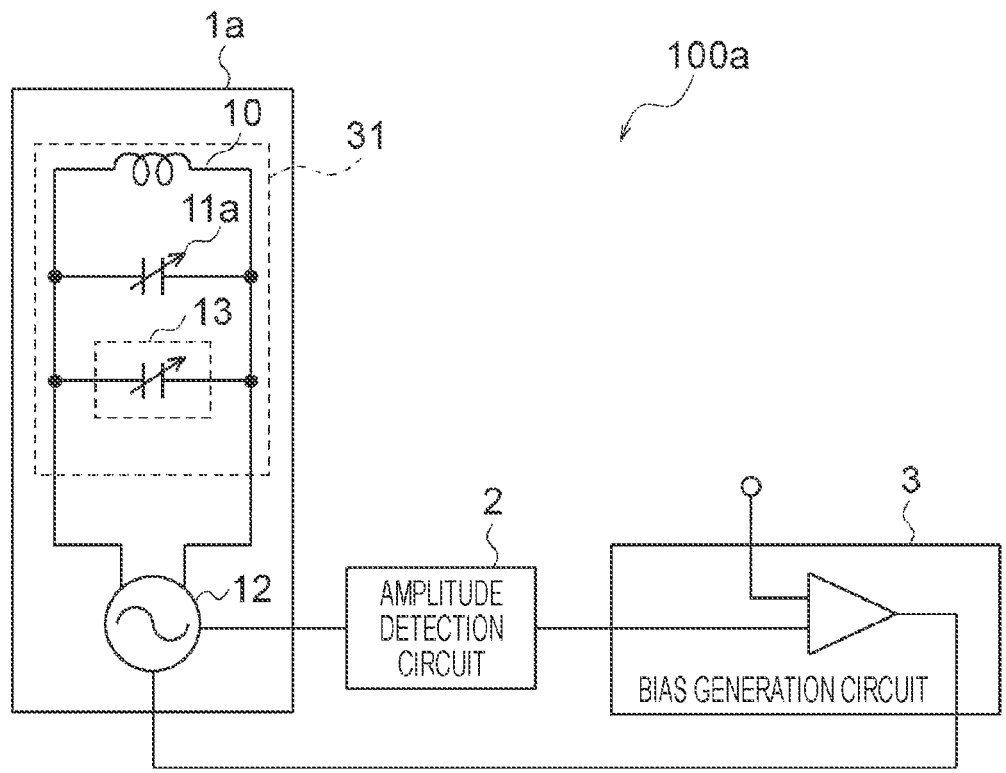
FIG. 4 is a block diagram illustrating an oscillator circuit that is an example of an oscillator circuit of a second embodiment according to the present technology.

FIG. 4 illustrates an oscillator circuit 100a, which is an example of an oscillator circuit of the second embodiment according to the present technology. FIG. 4 is a block diagram illustrating the oscillator circuit 100a, which is an example of the oscillator circuit of the second embodiment according to the present technology. Note that the same components as those in FIG. 1 are designated by the same reference signs, and the description thereof will be omitted as appropriate.

As illustrated in FIG. 4, the oscillator circuit 100a of the second embodiment according to the present technology is different from the oscillator circuit 100 shown in the first embodiment in that an LC oscillator circuit 1a includes a capacitor bank 11a and a temperature compensation varicap 13.

Figure 5:
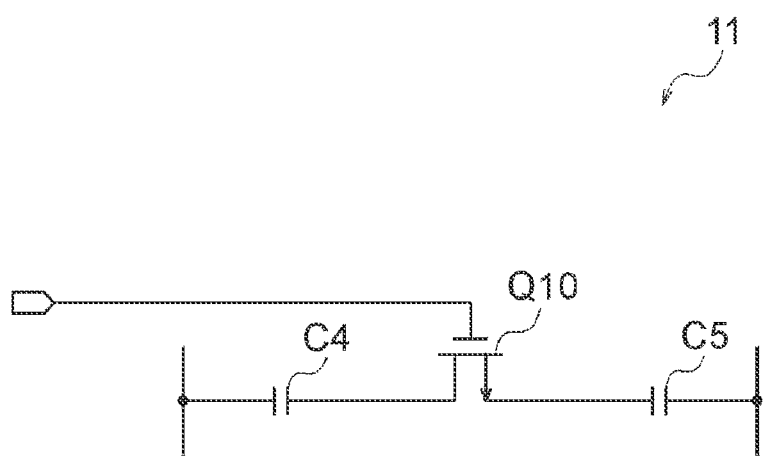
FIG. 5 is a block diagram illustrating a variable capacitance element that is an example of a variable capacitance element of the oscillator circuit of the second embodiment according to the present technology.

FIG. 5 illustrates a variable capacitance element 11, which is an example of a variable capacitance element of the oscillator circuit of the second embodiment according to the present technology. FIG. 5 is a block diagram illustrating a configuration example of the variable capacitance element 11 to which the present technology is applied.

As illustrated in FIG. 5, the variable capacitance element 11 includes a MOS switch Q10. Furthermore, the variable capacitance element 11 includes a capacitor C4 and a capacitor C5. The capacitor C4 and the capacitor C5 each include, for example, a metal insulator metal (MIM) capacitor or a metal oxide metal (MOM) capacitor. Therefore, the variable capacitance element 11 switches a capacitance value between oscillation terminals by short-circuiting or opening the capacitor C4 and the capacitor C5 by the MOS switch Q10. Note that the capacitor bank 11a includes a plurality of such variable capacitance elements 11.

Figure 6:
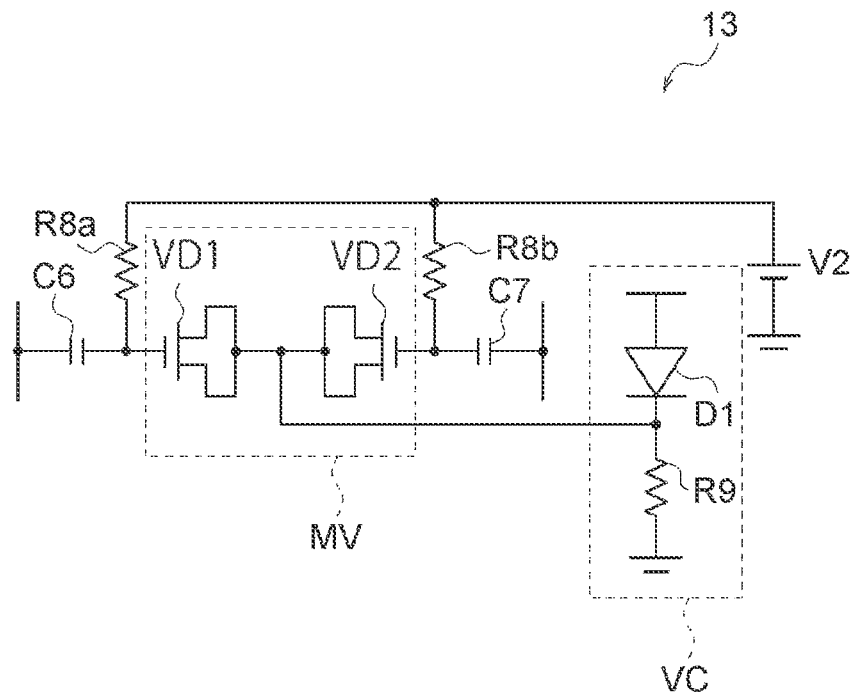
FIG. 6 is a block diagram illustrating a temperature compensation varicap that is an example of a temperature compensation varicap of the oscillator circuit of the second embodiment according to the present technology.

FIG. 6 illustrates the temperature compensation varicap 13, which is an example of the temperature compensation varicap of the oscillator circuit of the second embodiment according to the present technology. FIG. 6 is a block diagram illustrating the temperature compensation varicap 13, which is an example of the temperature compensation varicap of the oscillator circuit of the second embodiment according to the present technology.

As illustrated in FIG. 6, the temperature compensation varicap 13 includes a MOS varicap MV, a bias circuit VC, a capacitor C6, a capacitor C7, a resistor R8a, a resistor R8b, and a DC power supply V2. The MOS varicap MV includes a first varicap diode VD1 and a second varicap diode VD2. The bias circuit VC includes a resistor R9 and a diode D1. The bias circuit VC generates a bias voltage from the resistor R9 and the diode D1. The temperature compensation varicap 13 applies the bias voltage generated by the bias circuit VC to the MOS varicap MV to prevent the total capacitance value including the capacitor bank 11a from fluctuating.

The temperature compensation varicap 13 of the second embodiment according to the present technology prevents the entire capacitance value including the capacitor bank 11a from fluctuating due to a temperature fluctuation of the MOS switch Q10. In this case, temperature dependence of the temperature compensation varicap 13 is different from temperature dependence of the capacitor bank 11a. For example, the temperature dependence of the temperature compensation varicap 13 is opposite to the temperature dependence of the capacitor bank 11a.

As described above, the oscillator circuit 100a of the second embodiment according to the present technology can control an oscillation amplitude of the LC oscillator circuit 1a and simultaneously reduce a temperature fluctuation of the capacitance value of the capacitor bank 11a by the temperature compensation varicap 13. As a result, the oscillator circuit 100a of the second embodiment according to the present technology can reduce a temperature fluctuation of a local oscillation signal with high accuracy, and thus can always maintain a good reception state even if a free-run oscillator is used.

In particular, according to the oscillator circuit 100a of the second embodiment according to the present technology, in addition to the oscillator circuit 100 of the first embodiment according to the present technology, the temperature compensation varicap 13 is added to the LC oscillator circuit 1, so that it is possible to reduce temperature fluctuations of the capacities themselves of the capacitor bank 11a. Thus, it is possible to reduce the fluctuation in the oscillation frequency due to the temperature fluctuation to a small extent.

As a result, a frequency manually tuned by a user can be maintained even when the temperature fluctuates, so that the operability of an analog tuning radio receiver can be improved.

4. Third Embodiment (Example of Current Control)

An oscillator circuit of a third embodiment according to the present technology is, in the first embodiment, an oscillator circuit including a cross couple of n-type MOS transistors, in which sources of the cross couple of the n-type MOS transistors are commonly connected, and a constant current source is connected between a point where the common connection is made and a ground. Note that the same components as those of the LC oscillator circuit of the first embodiment are designated by the same reference signs, and the description thereof will be omitted as appropriate.

Figure 7:
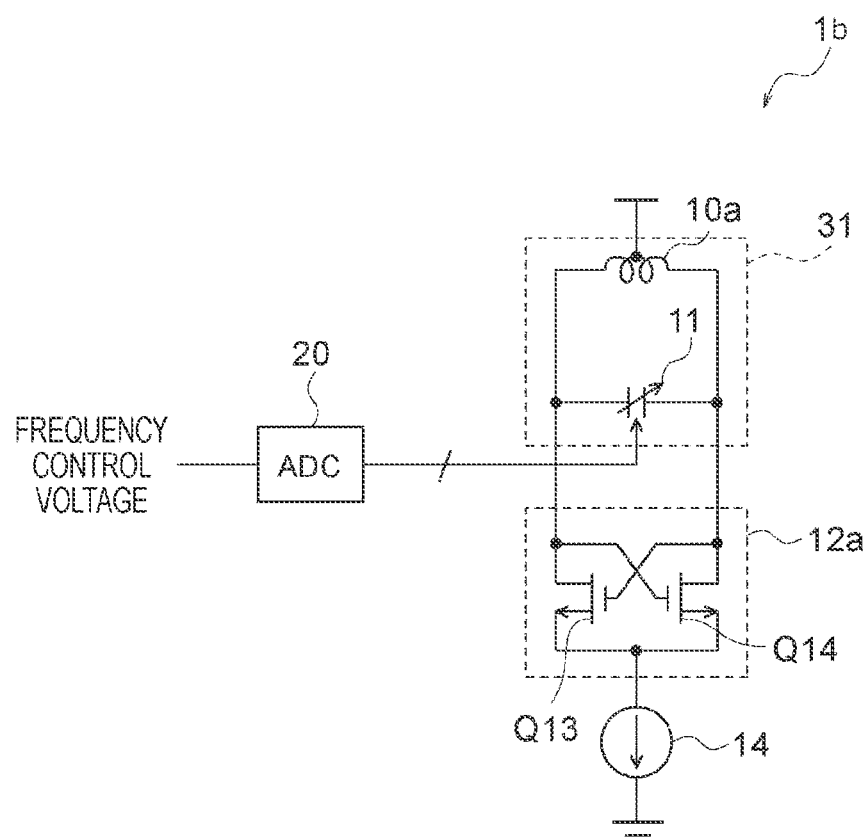
FIG. 7 is a block diagram illustrating an LC oscillator circuit of an oscillator circuit of a third embodiment according to the present technology.

FIG. 7 illustrates an LC oscillator circuit 1a of an oscillator circuit 100 of the third embodiment according to the present technology. FIG. 7 is a block diagram illustrating an LC oscillator circuit 1b of the oscillator circuit 100 of the third embodiment according to the present technology.

As illustrated in FIG. 7, the LC oscillator circuit 1b of the oscillator circuit 100 of the third embodiment according to the present technology includes an inductor (coil) 10a, an ADC20, a negative resistance circuit 12a, and a constant current source 14. The negative resistance circuit 12a includes a cross couple 12a of n-type MOS transistors. The LC oscillator circuit 1b controls an oscillation frequency by converting an input DC voltage into a digital signal by the ADC 20 and controlling a capacitance value of a variable capacitance element 11. In the LC oscillator circuit 1b, sources of the cross couple 12a of the n-type MOS transistors are commonly connected, and the constant current source 14 is connected between a point where the common connection is made and a ground.

With such a circuit configuration, in the LC oscillator circuit 1b, each of drains of the cross couple 12a of the n-type MOS transistors is connected to the inductor 10a and the variable capacitance element 11, and a current value of the constant current source 14 is controlled, so that the oscillation amplitude can be controlled. Note that, although the inductor 10a illustrated in FIG. 7 biases a power supply from the middle of the inductor, the inductor may be divided into two and a central portion may be used as the power supply.

5. Fourth Embodiment (Example 1 of Voltage Control)

An oscillator circuit of a fourth embodiment according to the present technology is, in the first embodiment, an oscillator circuit including a cross couple of n-type MOS transistors, in which sources of the cross couple of the n-type MOS transistors are commonly connected, and a resistor is connected between a point where the common connection is made and a ground.

A difference between the LC oscillator circuit of the fourth embodiment and the LC oscillator circuit of the third embodiment is that the current source 14 is replaced with resistors (resistors R10, R11, and R12) and the like. Note that the same components are designated by the same reference signs, and the description thereof will be omitted as appropriate.

Figure 8:
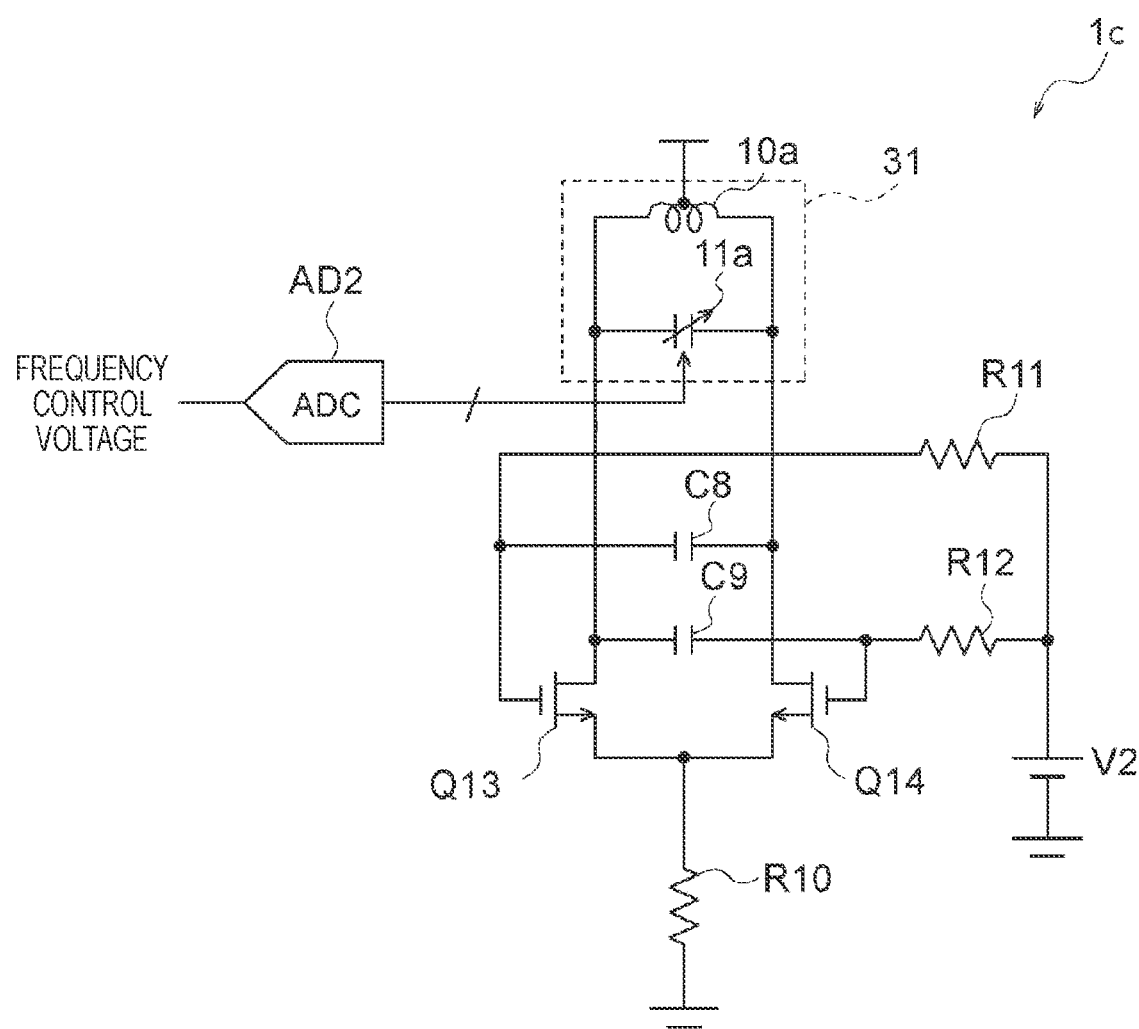
FIG. 8 is a block diagram illustrating an LC oscillator circuit of an oscillator circuit of a fourth embodiment according to the present technology.

FIG. 8 illustrates an LC oscillator circuit 1c of an oscillator circuit 100 of the fourth embodiment according to the present technology. FIG. 8 is a block diagram illustrating the LC oscillator circuit 1c of the oscillator circuit 100 of the fourth embodiment according to the present technology.

As illustrated in FIG. 8, in the LC oscillator circuit 1c of the oscillator circuit 100 of the fourth embodiment according to the present technology, the current source 14 of the LC oscillator circuit 1b illustrated in FIG. 7 is replaced with the resistors (resistors R10, R11, and R12). In this case, in the LC oscillator circuit 1c, sources of a cross couple 12a of n-type MOS transistors are commonly connected, and the resistor R10 is connected between a point where the common connection is made and a ground.

Furthermore, the LC oscillator circuit 1c includes a DC power supply V2 and applies a voltage in parallel to the resistors R11 and R12. The other end of the resistor R11 is connected to a gate of an n-type MOS transistor Q13 and is connected to a capacitor C8. Furthermore, the other end of the resistor R12 is connected to a gate of an n-type MOS transistor Q14 and is connected to a capacitor C9.

In addition, the other end of the capacitor C8 is connected to a drain of the n-type MOS transistor Q14, and the other end of the capacitor C9 is connected to a drain of the n-type MOS transistor Q13.

With such a circuit configuration, the LC oscillator circuit 1c can control an oscillation amplitude by applying a control voltage to the gates of the cross couple 12a of the n-type MOS transistors. As described above, the LC oscillator circuit 1c of the oscillator circuit 100 of the fourth embodiment according to the present technology can use the resistors (resistor R10, R11, and R12) and the like instead of the current source 14. Note that, although an inductor 10a illustrated in FIG. 8 biases a power supply from the middle of the inductor, the inductor may be divided into two and a central portion may be used as the power supply.

6. Fifth Embodiment (Example 2 of Voltage Control)

An oscillator circuit of a fifth embodiment according to the present technology is, in the fourth embodiment, an oscillator circuit in which a capacitance element is connected between sources of a cross couple of n-type MOS transistors.

A difference between the LC oscillator circuit of the fifth embodiment and the LC oscillator circuit of the fourth embodiment is that the capacitance element is connected between the sources of the cross couple of the n-type MOS transistors. Note that the same components as those in the fourth embodiment are designated by the same reference signs, and the description thereof will be omitted as appropriate.

Figure 9:
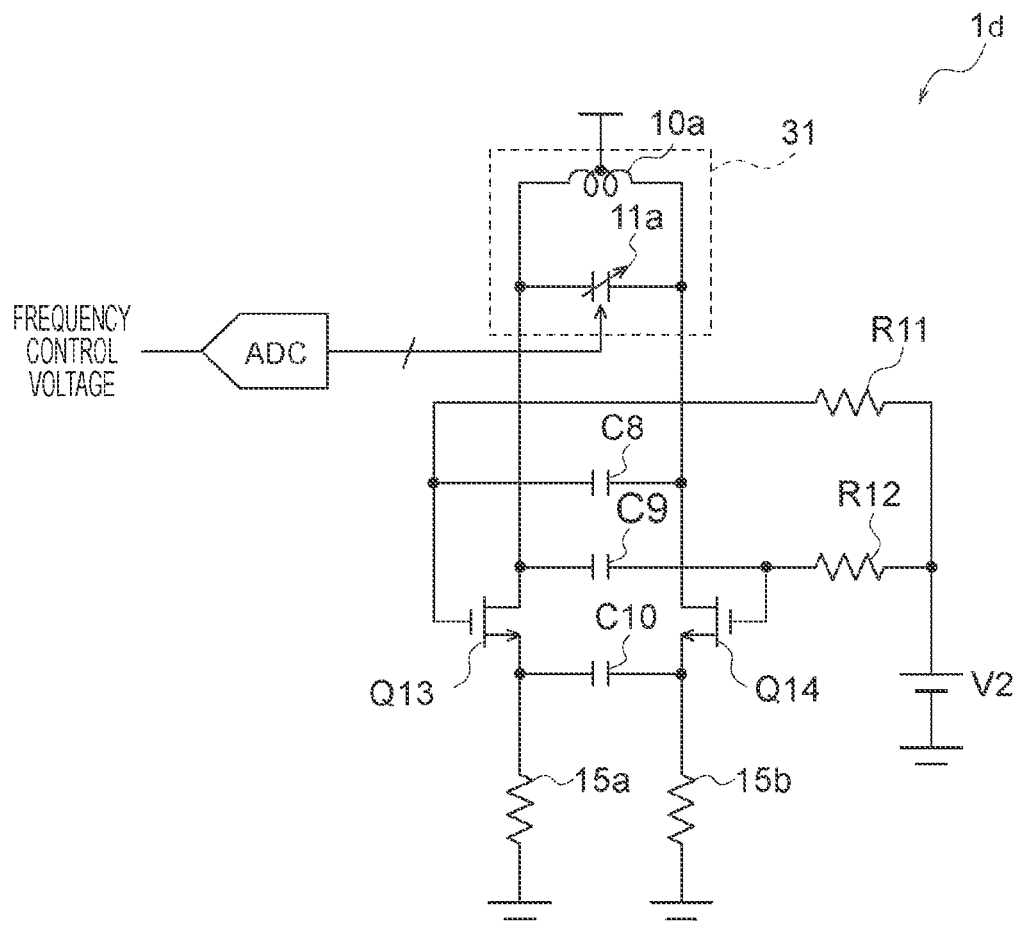
FIG. 9 is a block diagram illustrating an LC oscillator circuit of an oscillator circuit of a fifth embodiment according to the present technology.

FIG. 9 illustrates an LC oscillator circuit 1d of an oscillator circuit 100 of the fifth embodiment according to the present technology. FIG. 9 is a block diagram illustrating the LC oscillator circuit 1d of the oscillator circuit 100 of the fifth embodiment according to the present technology.

As illustrated in FIG. 9, in the LC oscillator circuit 1d of the oscillator circuit 100 of the fifth embodiment according to the present technology, a capacitance element C10 is connected between sources of a cross couple 12a of n-type MOS transistors of the LC oscillator circuit 1c illustrated in FIG. 8, and a resistor R15a is connected to a source of an n-type MOS transistor Q13, and a resistor R15b is connected to a source of an n-type MOS transistor Q14.

With such a circuit configuration, the LC oscillator circuit 1d can control an oscillation amplitude by applying a control voltage to gates of the cross couple 12a of the n-type MOS transistors.

7. Sixth Embodiment (Radio Receiver)

A radio receiver of a sixth embodiment according to the present technology is a radio receiver equipped with an oscillator circuit including an LC oscillator circuit, an amplitude detection circuit, and a bias generation circuit, in which the LC oscillator circuit includes an inductor and at least one variable capacitance element, the amplitude detection circuit detects an oscillation amplitude of the LC oscillator circuit and converts the oscillation amplitude into a DC voltage, and the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude. Furthermore, the radio receiver of the sixth embodiment according to the present technology may be a radio receiver equipped with the oscillator circuit of any one of the first to fifth embodiments according to the present technology.

Figure 10:
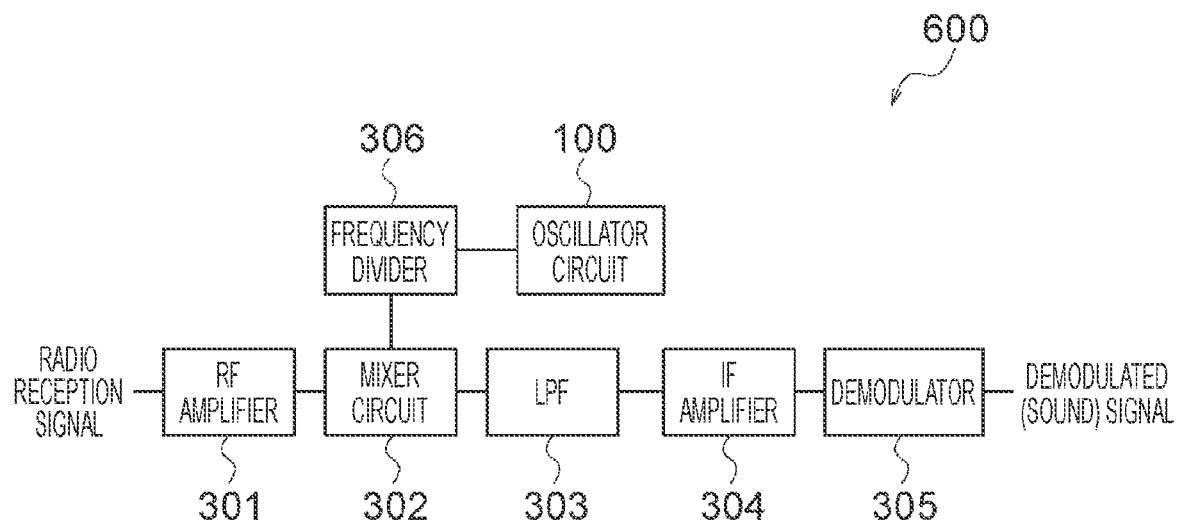
FIG. 10 is a diagram illustrating a radio receiver using the oscillator circuit of the first to fifth embodiments to which the present technology is applied.

FIG. 10 is a diagram illustrating an example of a radio receiver 600 using the oscillator circuit of any one of the first to fifth embodiments according to the present technology.

The oscillator circuits of the first to fifth embodiments described above can be used for the radio receiver 600 as illustrated in FIG. 10. That is, the radio receiver 600 includes an RF amplifier 301, a mixer circuit 302, an LPF 303, an IF amplifier 304, a demodulator 305, a frequency divider 306, and an oscillator circuit 100.

The radio receiver 600 amplifies an AM-modulated or FM-modulated high-frequency radio signal with the RF amplifier 301. The radio receiver 600 then converts the amplified high-frequency radio signal into a low-frequency intermediate frequency in the mixer circuit 302. The intermediate frequency obtained by the conversion is amplified by the IF amplifier 304 after a high frequency component is cut off via the LPF 303. The amplified intermediate frequency is then demodulated (detected) by the demodulator 305 and output as sound.

According to the radio receiver 600 of the sixth embodiment according to the present technology, it is possible to reduce a fluctuation in an oscillation amplitude due to a temperature fluctuation, so that a fluctuation in an oscillation frequency due to the temperature can be reduced to a small extent. As a result, the radio receiver of the sixth embodiment according to the present technology can reduce an amplitude fluctuation of the LC oscillator circuit, and thus can maintain a manually tuned frequency.

Note that embodiments according to the present technology are not limited to the above-described embodiments, and various modifications can be made without departing from the gist of the present technology.

Furthermore, the first to fifth embodiments according to the present technology are not limited to the above-described embodiments, and various modifications can be made without departing from the gist of the present technology.

Furthermore, the effects described in the present specification are merely examples and are not limited, and other effects may be obtained.

Furthermore, the present technology may have the following configurations.

(1) An oscillator circuit including
an LC oscillator circuit,
an amplitude detection circuit, and
a bias generation circuit, in which
the LC oscillator circuit includes an inductor and at least one variable capacitance element,
the amplitude detection circuit detects an oscillation amplitude of the LC oscillator circuit and converts the oscillation amplitude into a DC voltage, and
the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude.

(2) The oscillator circuit according to (1), in which the LC oscillator circuit includes a capacitor bank and a temperature compensation varicap,
the capacitor bank includes a MOS switch, and
the temperature compensation varicap prevents a capacitance value of the capacitor bank from fluctuating due to a temperature fluctuation of the MOS switch.

(3) The oscillator circuit according to (2), in which temperature dependence of the temperature compensation varicap is different from temperature dependence of the capacitor bank.

(4) The oscillator circuit according to (2) or (3), in which the temperature compensation varicap includes a MOS varicap and,
a bias voltage is applied to the MOS varicap to prevent the capacitance value of the capacitor bank from fluctuating.

(5) The oscillator circuit according to (4), in which the bias voltage is generated by a bias circuit including a resistor and a diode.

(6) The oscillator circuit according to any one of (1) to (5), in which the bias signal is a voltage.

(7) The oscillator circuit according to any one of (1) to (6), further including a cross couple of n-type MOS transistors, in which
sources of the cross couple of the n-type MOS transistors are commonly connected, and a constant current source is connected between a point where the common connection is made and a ground.

(8) The oscillator circuit according to (7), in which each of drains of the cross couple of the n-type MOS transistors is connected to the inductor and the variable capacitance element, and
a current value of the constant current source is controlled to control the oscillation amplitude.

(9) The oscillator circuit according to any one of (1) to (6), further including a cross couple of n-type MOS transistors, in which
sources of the cross couple of the n-type MOS transistors are commonly connected, and a resistor is connected between a point where the common connection is made and a ground.

(10) The oscillator circuit according to (9), in which a capacitance element is connected between the sources of the cross couple of the n-type MOS transistors.

(11) A radio receiver equipped with an oscillator circuit including
an LC oscillator circuit,
an amplitude detection circuit, and
a bias generation circuit, in which
the LC oscillator circuit includes an inductor and at least one variable capacitance element,
the amplitude detection circuit detects an oscillation amplitude of the LC oscillator circuit and converts the oscillation amplitude into a DC voltage, and
the bias generation circuit compares the DC voltage with a voltage for generating a bias signal, the voltage changing on the basis of a temperature fluctuation of the bias generation circuit, calculates a difference between the DC voltage and a voltage after the change, and generates, on the basis of the difference, a bias signal that reduces a fluctuation in the oscillation amplitude, to control the oscillation amplitude.

(12) A radio receiver equipped with the oscillator circuit according to any one of (1) to (10).

REFERENCE SIGNS LIST

1, 1a LC oscillator circuit
2 Amplitude detection circuit
3 Bias generation circuit
10, 10a Inductor
11 Variable capacitance element
11a Capacitor bank
12 Negative resistance circuit
12a Cross couple of n-type MOS transistors
13 Temperature compensation varicap
100 Oscillator circuit
600 Radio receiver
R10, R11, R12 Resistor
C10 Capacitance element
MV MOS varicap
VC Bias circuit

The invention claimed is:

1. An oscillator circuit comprising:
an LC oscillator circuit,
wherein
the LC oscillator circuit includes:
an inductor;
a capacitor bank that includes a MOS switch; and
a temperature compensation varicap,
the temperature compensation varicap is configured to control a capacitance value of the capacitance bank to prevent fluctuation of the capacitance value, and
the fluctuation of the capacitance value is based on a temperature fluctuation of the MOS switch;
an amplitude detection circuit configured to:
detect an oscillation amplitude of the LC oscillator circuit; and
convert the oscillation amplitude into a DC voltage; and
a bias generation circuit configured to:
compare the DC voltage with a reference voltage, wherein the reference voltage is variable based on a temperature fluctuation of the bias generation circuit,
calculate a difference between the DC voltage and the reference voltage,
generate a bias signal, based on the difference between the DC voltage and the reference voltage, wherein reduction of a fluctuation in the oscillation amplitude is based on the bias signal, and
control the oscillation amplitude based on the generated bias signal.

2. The oscillator circuit according to claim 1, wherein temperature dependence of the temperature compensation varicap is different from temperature dependence of the capacitor bank.

3. The oscillator circuit according to claim 1, wherein
the temperature compensation varicap further includes a MOS varicap, and
the temperature compensation varicap is further configured to apply a bias voltage to the MOS varicap.

4. The oscillator circuit according to claim 3, wherein
the temperature compensation varicap further includes a bias circuit,
the bias circuit includes a resistor and a diode, and
the bias circuit is configured to generate the bias voltage.

5. The oscillator circuit according to claim 1, wherein the bias signal is a voltage.

6. The oscillator circuit according to claim 1, further comprising a cross couple of n-type MOS transistors and a variable capacitance element, wherein sources of the cross couple of the n-type MOS transistors are commonly connected, and a constant current source is connected between a point of the common connection and a ground.

7. The oscillator circuit according to claim 6, wherein
each of drains of the cross couple of the n-type MOS transistors is connected to the inductor and the variable capacitance element, and
the LC oscillator circuit is configured to control the oscillation amplitude based on a current value of the constant current source.

8. The oscillator circuit according to claim 1, further comprising a cross couple of n-type MOS transistors, wherein sources of the cross couple of the n-type MOS transistors are commonly connected, and a resistor is connected between a point of the common connection and a ground.

9. The oscillator circuit according to claim 8, further comprising a capacitance element, wherein connection of the capacitance element is between the sources of the cross couple of the n-type MOS transistors.

10. A radio receiver equipped with an oscillator circuit, including
an LC oscillator circuit,
wherein
the LC oscillator circuit includes:
an inductor;
a capacitor bank that includes a MOS switch; and
a temperature compensation varicap,
the temperature compensation varicap is configured to control a capacitance value of the capacitance bank to prevent fluctuation of the capacitance value, and
the fluctuation of the capacitance value is based on a temperature fluctuation of the MOS switch;
an amplitude detection circuit configured to:
detect an oscillation amplitude of the LC oscillator circuit; and
convert the oscillation amplitude into a DC voltage; and
a bias generation circuit configured to:
compare the DC voltage with a reference voltage, wherein the reference voltage is variable based on a temperature fluctuation of the bias generation circuit,
calculate a difference between the DC voltage and the reference voltage,
generate a bias signal, based on the difference between the DC voltage and the reference voltage, wherein reduction of a fluctuation in the oscillation amplitude is based on the bias signal, and
control the oscillation amplitude based on the generated bias signal.

11. An oscillator circuit, comprising:
an LC oscillator circuit, wherein
the LC oscillator circuit includes:
an inductor;
at least one variable capacitance element; and
a cross couple of n-type MOS transistors,
sources of the cross couple of the n-type MOS transistors are commonly connected, and a constant current source is connected between a point of the common connection and a ground;
an amplitude detection circuit configured to:
detect an oscillation amplitude of the LC oscillator circuit; and
convert the oscillation amplitude into a DC voltage; and
a bias generation circuit configured to:
compare the DC voltage with a reference voltage, wherein the reference voltage is variable based on a temperature fluctuation of the bias generation circuit,
calculate a difference between the DC voltage and the reference voltage,
generate a bias signal, based on the difference between the DC voltage and the reference voltage, wherein reduction of a fluctuation in the oscillation amplitude is based on the bias signal, and
control the oscillation amplitude based on the generated bias signal.

* * * * *